(12) United States Patent
Nagata (10) Patent No.: US 10,916,597 B2
(45) Date of Patent: Feb. 9, 2021

(54) DISPLAY DEVICE

(71) Applicant: Japan Display Inc., Minato-ku (JP)

(72) Inventor: Tetsuya Nagata, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 114 days.

(21) Appl. No.: 16/238,550

(22) Filed: Jan. 3, 2019

(65) Prior Publication Data

US 2019/0221618 A1 Jul. 18, 2019

(30) Foreign Application Priority Data

Jan. 12, 2018 (JP) .................................. 2018-003356

(51) Int. Cl.
*H01L 27/32* (2006.01)
*F16K 31/00* (2006.01)
*H01L 51/00* (2006.01)
*H01L 51/52* (2006.01)

(52) U.S. Cl.
CPC ........ *H01L 27/3225* (2013.01); *F16K 31/002* (2013.01); *H01L 51/0097* (2013.01); *H01L 51/5237* (2013.01); *H01L 27/3244* (2013.01); *H01L 27/3272* (2013.01); *H01L 2227/323* (2013.01); *H01L 2251/5338* (2013.01)

(58) Field of Classification Search
CPC ........... H01L 51/0097; H01L 2227/323; H01L 2251/5338; G06F 1/1652
See application file for complete search history.

(56) References Cited

U.S. PATENT DOCUMENTS

| 2011/0260180 | A1 | 10/2011 | Kuranaga et al. |
| 2013/0181204 | A1 | 7/2013 | Kuranaga et al. |
| 2014/0099479 | A1* | 4/2014 | Krall ............... G06F 1/1652 428/174 |
| 2015/0021570 | A1* | 1/2015 | Kim ............... H01L 51/5293 257/40 |
| 2017/0212556 | A1* | 7/2017 | Jovanovic ......... H01L 51/5237 |

FOREIGN PATENT DOCUMENTS

JP 2011/0260180 11/2011

* cited by examiner

*Primary Examiner* — David C Spalla
(74) *Attorney, Agent, or Firm* — Oblon, McClelland, Maier & Neustadt, L.L.P.

(57) ABSTRACT

A display device according to an embodiment of the present invention includes: a flexible substrate having a plurality of pixels, each of the plurality of pixels comprising a display element, the plurality of pixels being arranged in a display area; and an at least one actuator which is provided so as to fit a backside of the substrate and bends the substrate, wherein the at least one actuator is provided with a layer to shift from a flexible state to a state to have a predetermined shape and vice versa by being driven electrically, and the at least one actuator does not overlap the display element in a plan view.

15 Claims, 6 Drawing Sheets

DISPLAY DEVICE

CROSS-REFERENCE TO RELATED APPLICATION

The present application claims priority from Japanese application JP2018-003356 filed on Jan. 12, 2018, the content of which is hereby incorporated by reference into this application.

BACKGROUND OF THE INVENTION

1. Field of the Invention

The present invention relate to a display device. In particular, one or more embodiments of the present invention relate to a flexible display device where a display element is formed on a substrate having flexibility.

2. Description of the Related Art

As a display device, a flexible display is developed where a display element is formed on a substrate having flexibility. For example, as described in JP2011-227369A, a flexible display is known on which an organic light emitting diode (OLED) is formed as the display element.

SUMMARY OF THE INVENTION

A flexible display contributes to an improvement of storability and portability such as foldability and windability, making good use of flexibility of a substrate. However, when using that flexible display, since it has flexibility, deformation applied while it is stored does not completely disappear, and the displayed image tends to be distorted.

Meanwhile, in the case where its rigidity is controlled by arranging an actuator on the whole of the backside of the flexible display, the display function of the display element of the flexible display is possibly disturbed by a thermal or electric influence from the actuator.

Therefore, one of the objects of the present invention is to provide a display device where the display function is not disturbed by driving of the actuator, while at the same time maintaining good visibility and handling property when the flexible display is extended for a use.

A display device according to an embodiment of the present invention includes: a flexible substrate having a plurality of pixels, each of the plurality of pixels comprising a display element, the plurality of pixels being arranged in a display area; and an at least one actuator which is provided so as to fit a backside of the substrate and bends the substrate, wherein the at least one actuator is provided with a layer to shift from a flexible state to a state to have a predetermined shape and vice versa by being driven electrically, and the at least one actuator does not overlap the display element in a plan view.

DETAILED DESCRIPTION OF THE INVENTION

Below, the respective embodiments of the present invention will be described, referring to the drawings.

The disclosed embodiments are merely examples, and appropriate variations within the spirit of the present invention that can be easily arrived at by those skilled in the art are naturally included in the scope of the present invention. Further, while the width, thickness, shape, and the like of each part in the drawings may be illustrated schematically as compared with actual embodiments in order to clarify the explanation, these are merely examples and an interpretation of the present invention should not be limited thereto. Furthermore, in the specification and respective drawings, the same reference symbols may be applied to elements similar to those that have already been illustrated in another drawing and a detailed explanation of such elements may be omitted as appropriate.

Further, in the detailed description of the one or more embodiments of the invention, when a positional relationship between one component and another component is defined, the words "on" and "under" are not used only in a case where the other component is positioned directly on or under the one component, but those words are also used in a case where still another component is interposed between the one component and the other component, unless otherwise stated.

First Embodiment

Figure 1A:
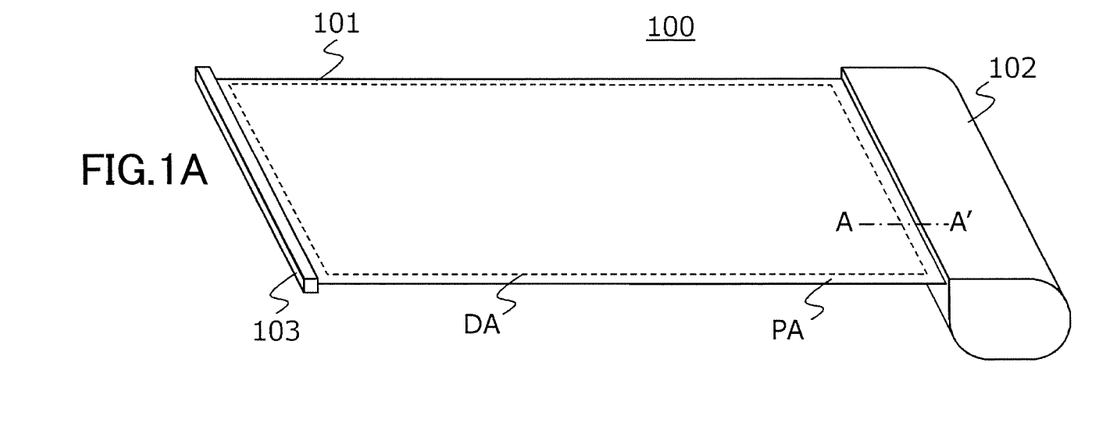
FIGS. 1A, 1B and 1C are diagrams showing an external appearance and a cross sectional structure of when it is stored of a display device according to an embodiment of the present invention.
Figure 1B:
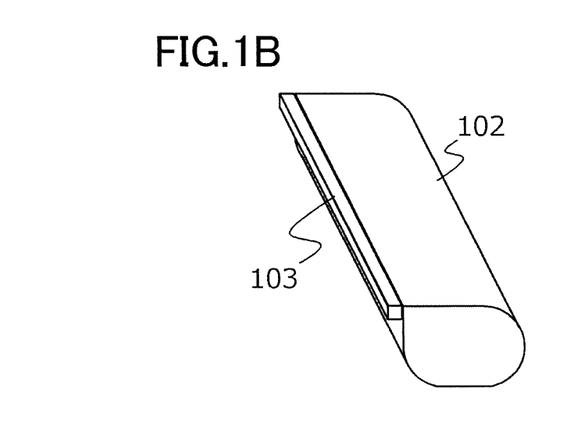
Figure 1C:
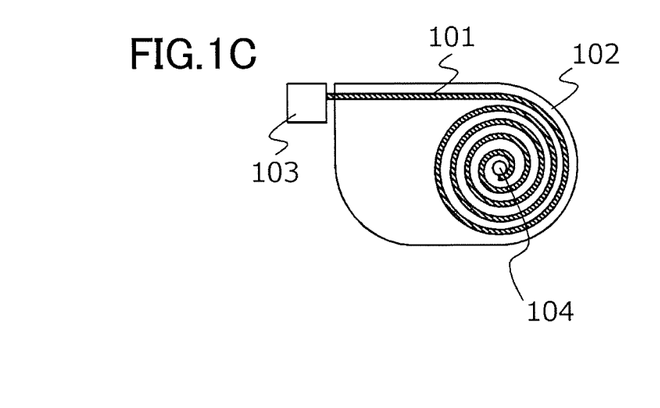

In FIGS. 1A, 1B and 1C, a display device of an embodiment of the present invention is shown. In FIG. 1A, a display device 100 has a flexible display 101, a housing 102, and a drawing tab 103. The flexible display 101 has a display area DA, and a peripheral area PA outside the display area DA on a substrate having flexibility. On the display area DA, a plurality of pixels are arranged in a matrix, and in each of the pixels a display element (e.g., an OLED) is provided which is controlled depending on luminance information. In the peripheral area PA, for example, a driving circuit for driving the plurality of pixels is provided.

As shown in FIG. 1B, the flexible display 101 is configured such that the substrate can be stored in the housing 102. At this time, as shown in FIG. 1C, the flexible display is winded on an axis body 104 and is stored in the housing 102. When extending the flexible display 101, the drawing tab 103 is drawn. This drawing tab 103 functions also as a stopper which works so that an edge of the flexible display 101 is not drawn into the housing 102, when winding the flexible display 101 into the housing 102.

In FIG. 1A to FIG. 1C, although the housing 102 is illustrated merely as a storage part of the flexible display 101, the housing 102 may additionally have a control panel, a keyboard, and the like, and the housing 102 may be provided as a part of another electronic device.

The flexible display 101 has flexibility at its substrate. Therefore, when the flexible display 101 is extended from the housing 102, if its deformation applied while it is stored in the housing 102 does not completely disappear, there occurs bending of it.

Figure 2A:
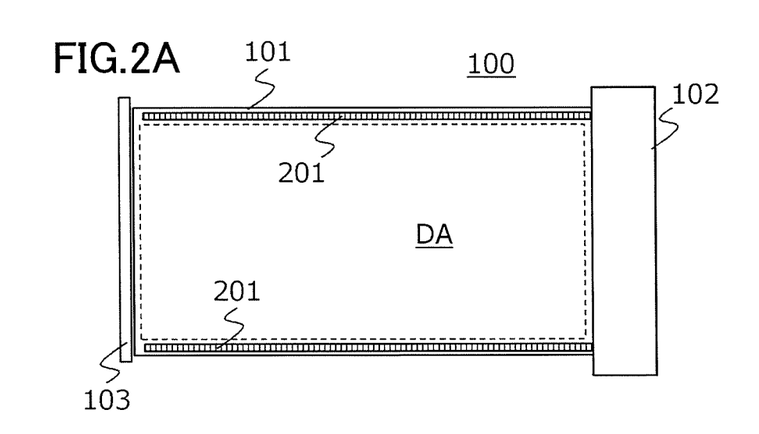
FIGS. 2A, 2B and 2C are diagrams showing an arrangement and an operation of an actuator on a display device according to an embodiment of the present invention.

Then, as shown in FIG. 2A, an actuator 201 to maintain flatness of the display area DA when the flexible display 101 is extended is provided. The actuator 201 is in a flexible state at a normal condition when it is not driven (i.e., when energy is not input into it). The actuator 201 has a function to shift from the flexible state to a highly rigid state due to an input of energy, and return from the highly rigid state to the flexible state when the input of energy is ended. As a method with which the energy is input, in addition to application of an electric voltage or an electric current, various kinds of methods such as application of heat, application of magnetic field, irradiation of light, and a chemical reaction, can be considered, and they can be selected as appropriate.

Figure 2B:
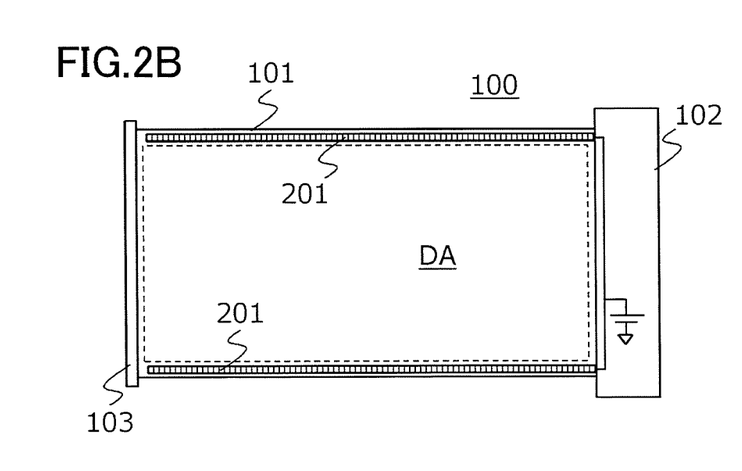
Figure 2C:
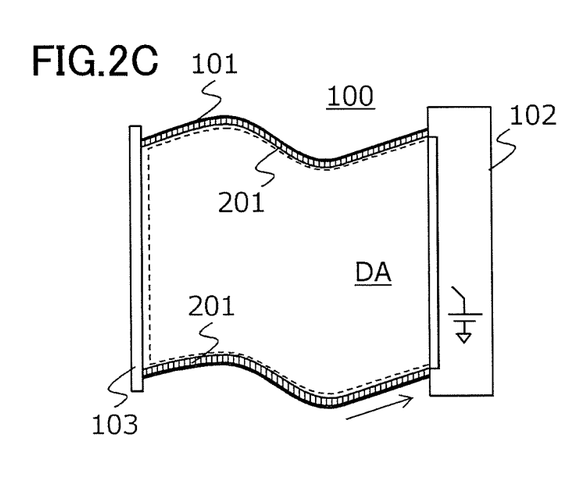

In FIG. 2A, as an example, the actuator 201 which is electrically driven is selected. This actuator 201 has, for example, a shape memory alloy layer and a polymer material layer. After or in response to the extension of the flexible display 101, an electric voltage or an electric current is applied to the actuator 201. Due to this, the actuator 201 shifts from the flexible state, which it was in before the application of the electric voltage or the electric current, to the highly rigid state. The actuator 201 in the highly rigid state is straight-line-like in a plan view and in a cross sectional view, and as shown in FIG. 2B, the flexible display 101 is maintained to be in a planar state. Further, when storing the flexible display 101 in the housing 102, the application of the electric voltage or the electric current to the actuator 201 is ended. Due to this, the actuator 201 shifts to the flexible state, which it was in before the application of the electric voltage or the electric current, from the highly rigid state. Thereafter, as shown in FIG. 2C, the flexible display 101 can be winded and stored inside the housing 102.

As an application method of the electric voltage or the electric current to the actuator 201, a method such as holding the form memory alloy layer or the polymer material layer as described above by a pair of electrodes and applying the electric voltage or the electric current between the pair of electrodes can be mentioned, but the application method is not limited to this. Further, the actuator 201 can be controlled by heat which is generated due to the application of the electric voltage or the electric current.

Here, the arrangement of the actuator 201 is described. In the case where the OLED is used as the display element, the resistance value of the OLED varies according to the temperature, and it is favorable to take considerations so that the influence of the heat from the actuator 201 will not occur locally. However, even in the case where the actuator 201 does not function due to the application of heat, it often generates heat due to the application of the electric voltage or the electric current as described above. Therefore, the display element and the actuator 201 need to be arranged so that they do not overlap each other.

One example is, as shown in FIG. 2A, a configuration to arrange the actuator 201 so that it avoids the display area DA but overlaps the peripheral area PA. In FIG. 2A, the actuator 201 is arranged linearly along the long side of the flexible display 101. Further, although not shown in FIG. 2A, in the peripheral area PA also, the actuator 201 may be provided along the short side of the flexible display 101. That is, it is sufficient only if the actuator 201 is arranged in parallel with the circular arc direction of the winding, in the direction reverse to the direction in which the stress to occur at the time of winding is applied.

Figure 3:
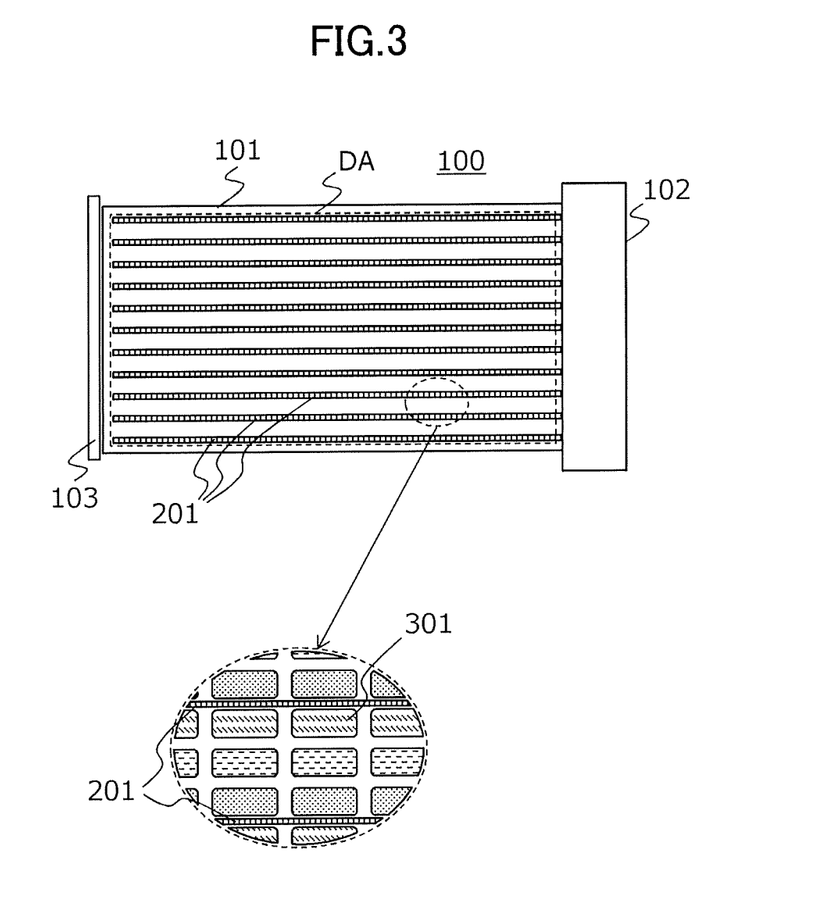
FIG. 3 is a diagram showing an arrangement of an actuator on a display device according to an embodiment of the present invention.

As an example different from the one shown in FIG. 2A, as shown in FIG. 3, the actuator 201 may be arranged so as to overlap the display area DA. At this time, each actuator 201 is preferably arranged linearly so that it will not two-dimensionally overlap the display region (e.g., a light emitting area of the OLED) 301 of the display element. Further, in FIG. 3, the actuator 201 extends only in a direction which is parallel with the long side of the display area DA. However, it may be configured to extend also in a direction which is parallel with the short side of the display area DA, and may be arranged to be mesh-like.

In the configurations shown in FIG. 2A, 2B and FIG. 3, the actuator 201 extends from one edge of the display area DA to the other edge (in FIG. 2A 2B and FIG. 3, one of the short sides corresponds to the one edge, and the other of the short sides corresponds to the other edge). In this case, by the control of the actuator, the whole of the display area DA turns into the flexible state, or into the highly rigid state in unison.

Figure 4A:
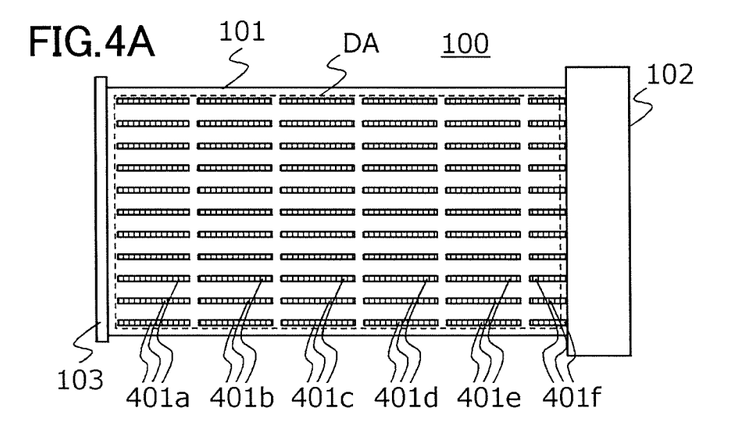
FIGS. 4A, 4B and 4C are diagrams showing an arrangement of an actuator on a display device according to an embodiment of the present invention.

As a variation, a display device is described with which a user can draw out the flexible display 101 for his usage by an appropriate length from the housing 102 in accordance with a usage purpose. In a case where a usage mode of the user like this is assumed, as shown in FIG. 4A, actuator 201 is provided in a manner that it is divided into a plurality of elements. In the example of FIG. 4A, the actuator 201 is provided in a manner that it is divided into 401a to 401f, being aligned in the direction parallel with the long side of the display area DA.

Figure 4B:
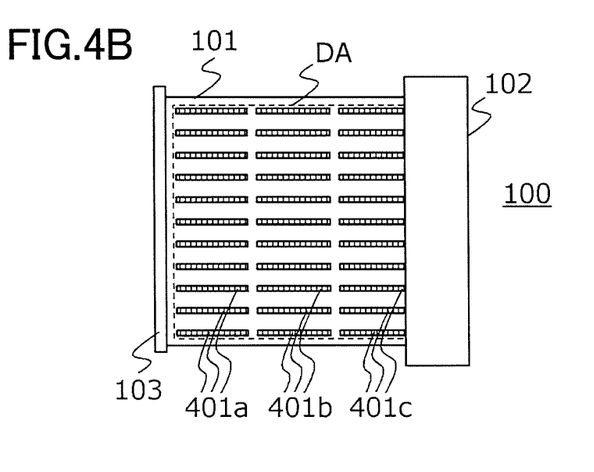

Further, the actuators 401a to 401f may respectively perform controls which are independent from one another. FIG. 4B shows a state where the flexible display 101 is partially drawn out from the housing 102. A part of the flexible display 101 is drawn out from the housing 102, and as for the drawn out part of the flexible display 101, the actuators 401a to 401c are controlled to be in the highly rigid state. In this case, the actuators 401a to 401c provided on the drawn out part is in the highly rigid state, and the actuators 401d to 401f provided on the rest of the flexible display 101 which is still staying inside the housing 102 are in the flexible state.

Figure 4C:
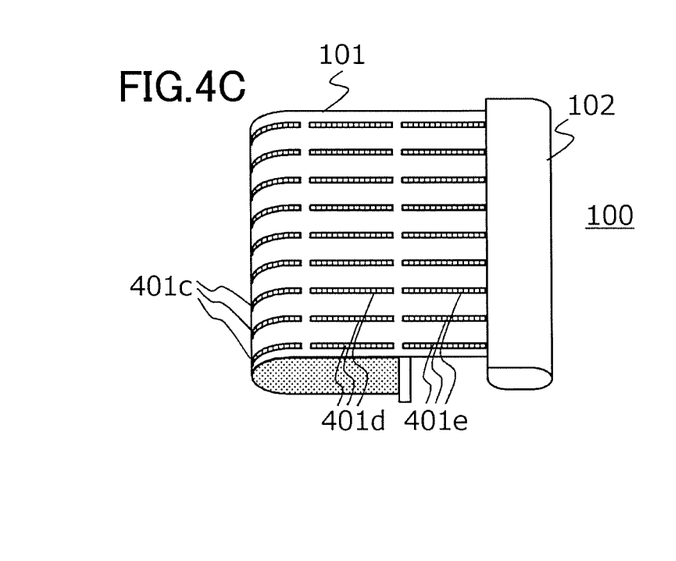

Further, the actuators 401a to 401f may respectively perform independent control. For example, by drawing out the flexible display 101 from the housing 102, controlling the actuator 401c to be in the flexible state, and controlling the rest of the others to be in the highly rigid state, it becomes possible to use the flexible display 101 in a state where it is folded in two (bent at the area where the actuator 401c is located, as shown in FIG. 4C). At this time, it may be configured that the whole of the surface of the display area DA functions as the effective display area and the display area DA is used in a manner that a user can view the image from both of the front side and back side of the flexible display 101 which is folded in two, and also, it may be configured that a part of the display area DA which is positioned on the backside (from the user's perspective) does not display an image. This time, the control as to what part of the display area DA becomes the effective area and the control of the actuator may be linked together.

Second Embodiment

Figure 5A:
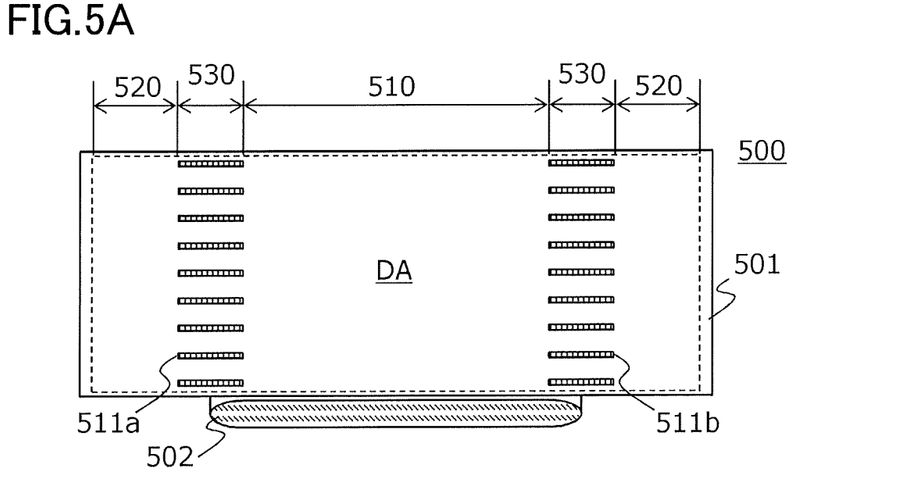
FIGS. 5A and 5B are a diagram showing an external appearance and an arrangement of an actuator of a display device according to an embodiment of the present invention.

Next, a display device of an embodiment of the present invention which differs from the embodiment described in the "First Embodiment" is described. The present embodiment is a display device which can be stored by folding a flexible display 501 along edges of a housing 502. Note that the same descriptions which have already been given with respect to the first embodiment are not given here. As shown in FIG. 5A, a display device 500 has a structure that the flexible display 501 is provided on the housing 502, and the width of the flexible display 501 is larger than the width of the housing 502. The two edges of the housing 502 have an arc-like shape in a cross sectional view or a shape similar to that. On the flexible display 501, in an area which overlaps the two edges of the housing 502 in a plan view, actuators 511*a* and 511*b* are provided. The display area DA on the flexible display 501 extends beyond the two edges of the housing 502.

When the flexible display 501 is in the extended state as shown in FIG. 5A, both of the actuators 511*a* and 511*b* are in the highly rigid state, and the whole of the display area DA is controlled to be flat. The display area DA includes an area 510 which overlaps the flat part of the housing 502, an area 520 projecting right and left in a plan view and does not overlap the housing 502, and an area 530 including an area which overlaps the edges of the housing 502 in a plan view, and all of these can function as the effective display area.

Figure 5B:
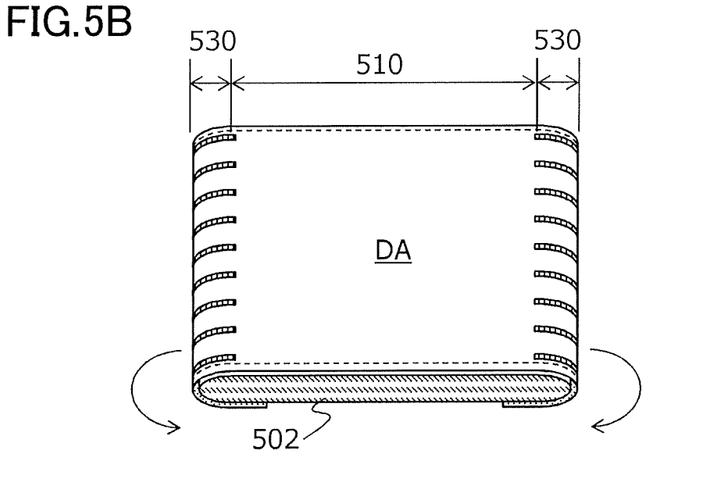

The area 520 can be stored and folded so as to fit the housing 502 as shown in FIG. 5B. At this time, both of the actuators 511*a* and 511*b* provided on the area 530 turn into the flexible state, and does not deteriorate the flexibility of the flexible display 501. In such a case, it may be configured that only the area 510 is used as the effective display area, and the area 520 on the backside and the area 530 positioned on the edges of the housing 502 stop displaying. Further, in the case where the flexible display 501 has a touch detection function, it may be configured that control key screen or the like is displayed on the area 530 in the configuration shown in FIG. 5B for example, and the control of the device can be performed through the touch sensor, viewing the display on the area 510. Although not shown in particular, in the configuration shown in FIG. 5B, the flexible display can be stored in a case on which an opening is provided so that the area 510, for example, is not covered.

[Structure of Flexible Display 101]

Subsequently, an example of a detailed structure of the flexible display 101 including the actuator is described.

Figure 6:
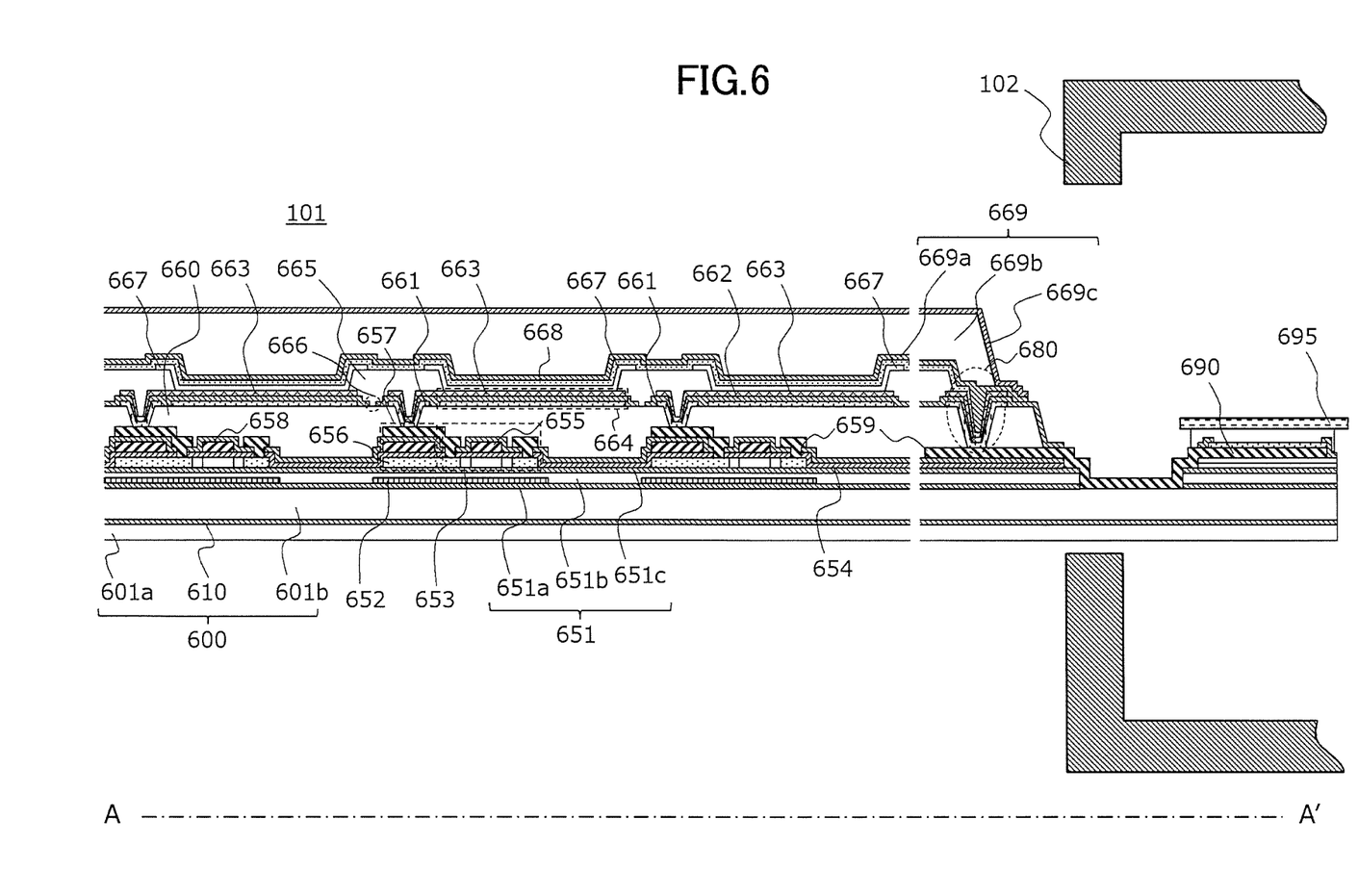
FIG. 6 is a diagram showing a cross sectional structure of a display device according to an embodiment of the present invention.

FIG. 6 is a schematic diagram of a structure of A-A' cross section of the display device 100 in FIG. 1A. Primarily, it shows the display area and the terminal part including NchTFT (n-channel type thin film transistor) which constitutes a pixel. A-A' cross section shows a part where the flexible display 101 is drawn into the housing 102.

In the present embodiment, an example that an actuator 610 is formed inside the substrate 600 having flexibility is shown. In FIG. 6, the actuator 610 is provided between a first resin layer 601*a* and a second resin layer 601*b*. A formation layer of the actuator 610 is not particularly limited to this, and it may be, for example, configured that the substrate 600 is constituted by a single layer, the first resin layer 601*a*, and the actuator 610 is provided thereunder.

On the second resin layer 601*b*, three layered lamination structure constituted by a silicon oxide film 651*a*, a silicon nitride film 651*b*, and a silicon oxide film 651*c* is provided as an undercoat layer 651. The lowermost layer, the silicon oxide film 651*a*, is provided in order to improve the adhesion to the second resin layer 601*b*. The middle layer, the silicon nitride film 651*b*, is provided as a block film with respect to external moisture and impurities. The uppermost layer, the silicon oxide film 651*c*, is provided as a block film which prevents dispersion of hydrogen atoms contained in the silicon nitride film 651*b* into the semiconductor layer side to be described later. However, note that the undercoat layer 651 is not particularly limited to the three layered lamination structure as described above; it may have another layer, and it may be configured as a single layered structure or a two layered structure.

Further, when forming the undercoat layer 651, a light shield film (an LS film) 652 may be formed at a position where the TFT is formed later. The LS film 652 can suppress changes in characteristics of TFT due to intrusion or the like of light from the backside of a channel of the TFT. Further, by forming the LS film 652 with a conductive layer and applying a predetermined electric potential to it, the back-gate effect can be given to the TFT. Here, after the formation of the silicon oxide film 651*a*, the LS film 652 is formed to have a shape of island at a position where the driving transistor (DRT) is formed. After that, the silicon nitride film 651*b* and the silicon oxide film 651*c* are laminated, and the LS film 652 is sealed by the undercoat layer 651. However, note that the formation process of this structure is not limited to the above, and it may be configured that the LS film 652 is formed on the second resin layer 601*b* first, and after that the undercoat layer 651 is formed.

On the undercoat layer 651, a TFT 653 is formed. As the TFT 653, a polysilicon TFT is adopted as an example, and only the NchTFT is shown here, but a PchTFT (p channel type thin film transistor) may be formed at the same time. The NchTFT has a structure that a low density impurity area is provided between a channel area and a source/drain area. In the present embodiment, a silicon oxide film is used for a gate insulating film 654, and a gate electrode 655 is formed of MoW (molybdenum-tungsten alloy: a first wiring). The first wiring forms a storage capacitor line in addition to a gate electrode of the TFT, and is also used to form a storage capacitor (Cs) 657 between itself and a polysilicon 656.

On the TFT, by laminating a silicon nitride film or a silicon oxide film to be an interlayer insulating film 658 and executing patterning after that, a contact hole which reaches the polysilicon 656 or the like is formed. Further, a conductive layer (a second wiring) 659 to be a source/drain electrode and a routing wiring is formed. Here, a three layered lamination structure of Ti, Al, and Ti is adopted. By the interlayer insulating film 658, an electrode formed of a conductive layer which is the same layer as the gate electrode of the TFT, and an electrode formed of a conductive layer which is the same layer as the source/drain wiring of the TFT, a part of the storage capacitor (Cs) 657 is formed. The routing wiring extends to the edge of the periphery of the substrate, and later forms a terminal 690 to be connected to the flexible printed substrate 695 and the driving IC. The terminal 106 may be formed of the same layer as the first wiring which forms the gate electrode 705.

After that, a planarizing film 660 is formed so as to cover the TFT and the routing wiring. As for the planarizing film 660, an organic material such as photosensitive acryl and polyimide are often used, and it is superior to an inorganic insulating material formed by the CVD (chemical vapor deposition) or the like in surface flatness.

The planarizing film 660 is removed at a part of the peripheral area PA and a pixel contact part. The part where the conductive layer 659 is not covered by the planarizing film 660 due to the removal of the planarizing film 660 is once covered by the ITO 661. The ITO 661 is once covered by a silicon nitride film 662, and forms an opening again at the pixel contact part, to thereby form a conductive layer 663 to be the pixel electrode. Here, the pixel electrode is formed as a reflective electrode, and has a three layered lamination structure of IZO, Ag, and IZO. In the pixel part, an additive capacitor (Cad) 664 is formed by the ITO 661, the silicon nitride film 662, and the conductive layer 663. On the other hand, the ITO 661 is formed also on the surface of the terminal 690. One of the purposes to provide the ITO on the wiring is to provide a barrier film so that a wiring exposition part will not be damaged in a process executed later.

Here, when patterning the pixel electrode (the conductive layer 663), the ITO 661 is exposed to an etching environment at some part. But the ITO 661 has a sufficient etching resistance with respect to the etching of the conductive layer 663, due to an annealing process performed between the formation of the ITO 661 and the formation of the conductive layer 663.

After the formation of the pixel electrode, an insulating layer called a bank (rib) 665, to be a separation wall of the pixel area, is formed. As for the bank 665, as in the case of the planarizing film 660, an organic material such as photosensitive acryl and polyimide is used. Favorably, the bank 665 is configured to have an opening which exposes the surface of the pixel electrode as the light emitting area, and an edge of the opening has a gently sloping tapered shape.

Here, the planarizing film 660 and the bank 665 contact each other at the opening 666 provided on the silicon nitride film 662 between them. This is an opening to discharge, by way of the bank 665, moisture and gas which are released from the planarizing film 660 through a heat processing and the like after the formation of the bank. By discharging them out of the planarizing film 660 via the opening 666 to the bank 665, separation of the planarizing film 660 and the silicon nitride film 662 at their interface can be prevented.

After the formation of the bank 665, an organic layer 667 which constitutes an organic EL layer is formed by lamination. In FIG. 6, the organic layer 667 is illustrated as a single layer, but a hole transport layer, a light emitting layer, and an electron transport layer are formed by lamination in order from the pixel electrode side. The organic layer 667 may be formed by sequentially forming the respective layers by evaporation, and may also be formed by dispersing the material composing the organic layer 667 into solvent and applying it. Further, as shown in FIG. 6, it may be formed selectively with respect to the respective pixels, and may also be formed by a mat foundation formation method all over the display area. In case of using the mat foundation formation method, it may be configured to have white light at all the pixels and then extract a desired wavelength component by a color filter (not shown).

After the formation of the organic layer 667, a counter electrode 668 is formed. In the present embodiment which adopts the top emission structure, the counter electrode 668 needs to be light transmitting. In this case, MgAg is formed as a thin film which is so thin that the light emitted from the organic EL layer can transmit. According to the formation order of the organic electrode 667 as described above, the pixel electrode becomes an anode, and the counter electrode becomes a cathode. The counter electrode 668 is formed over the display area DA and a cathode contact part 680 provided inside the peripheral area PA and in the vicinity of the display area DA, is connected to, at the cathode contact part 680, the conductive layer 659 under the cathode contact part 680, and is finally drawn out to the terminal 690.

After the formation of the counter electrode 668, a sealing film 669 is formed. One of the functions of the sealing film 669 is to prevent external moisture from intruding inside the organic layer which has been formed, and the sealing film 669 is demanded to have strong gas-barrier property as a sealing film. Here, as a lamination structure including a silicon nitride film, a lamination structure of a silicon nitride film 669*a*, an organic resin 669*b*, and a silicon nitride film 669*c* is adopted. Though not specifically shown here, between silicon nitride film 669*a* and the organic resin 669*b*, an amorphous silicon layer may be provided, one purpose of which is an enhancement of adhesion.

Due to the process as described above, the flexible display 101 is manufactured. The flexible printed substrate 695 which supplies a signal and electric power to the flexible display 101 is connected to the control substrate (not shown) inside the housing 102. The axis body for the winding as described above may include a controlling substrate.

The display device is not limited to the organic electroluminescence display device, and may be a display device including a light emitting element such as a quantum-dot light emitting diode (QLED) in each pixel.

The various modifications and adjustments to the embodiments will be readily apparent to those skilled in the art, and it is to be understood that these modifications and adjustments are included in the scope of the present invention. For example, the addition or deletion of a constituent element, a change in design, the addition or omission of a process, or a change in conditions which is appropriately performed by a person skilled in art with respect to each of the above described embodiments is also included in the scope of the invention when including the gist of the invention.

Furthermore, regarding the above-described embodiment, any additional advantage and effect which are obvious from the description of the specification or appropriately conceived by a skilled person are considered to be naturally achievable by the present invention.

What is claimed is:

1. A display device comprising:
    a flexible substrate including a plurality of pixels, each of the plurality of pixels comprising a display element, the plurality of pixels being arranged in a display area; and
    an at least one actuator which is provided so as to fit a backside of the substrate and is capable of bending the substrate, wherein
    the at least one actuator includes a layer to shift from a flexible state to a state to have a predetermined shape and vice versa by being driven electrically,
    the display element includes a pixel electrode, a counter electrode which is located farther from the at least one actuator than the pixel electrode, and a light emitting layer between the pixel electrode and the counter electrode,
    the light emitting, layer is configured to emit light toward and through the counter electrode, which is opposite to the at least one actuator across the light emitting layer,
    the at least one actuator overlaps the display area in a plan view, and is positioned between the display element of one of the plurality of pixels and the display element of another one of the plurality of pixels adjacent to the one of the plurality of pixels, and
    the at least one actuator does not overlap the display element in a plan view.

2. The display device according to claim 1, wherein
    the substrate further comprises a peripheral area provided around the display area, and
    the at least one actuator overlaps the peripheral area in a plan view.

3. The display device according to claim 1, wherein
    the at least one actuator is arranged linearly, and comprises one or more actuators aligned in parallel with a direction of a long side of the display area.

4. The display device according to claim 3, wherein
the at least one actuator is configured to have a length shorter than a length of the long side of the display area.

5. The display device according to claim 1, wherein
the at least one actuator is arranged linearly, and comprises one or more actuators aligned in parallel with a direction a short side of the display area.

6. The display device according to claim 5, wherein
the at least one actuator is configured to have a length shorter than a length of the short side of the display area.

7. The display device according to claim 3, further comprising a housing to wind the substrate and the at least one actuator and store them, wherein
the housing winds the substrate and the at least one actuator in a direction parallel with a line along which the at least one actuator is provided, and stores them, and
the substrate and the at least one actuator maintains a winded state while they are stored in the housing.

8. The display device according to claim 5, further comprising a housing to wind the substrate and the at least one actuator, and store them, wherein
the housing winds the substrate and the at least one actuator in a direction parallel with a line along which the at least one actuator is provided, and stores them, and
the substrate and the at least one actuator maintains a winded state while it is stored in the housing.

9. The display device according to claim 1, further comprising a housing to fix the substrate and the at least one actuator to overlap the display area in a plan view, wherein
the housing has an edge part which has an arc-like cross section, and
the substrate and the at least one actuator maintains, in a case where the at least one actuator is not driven, a state where they are bent along the edge part having the arc-like cross section.

10. The display device according to claim 9, wherein
the at least one actuator overlaps at least an area which is bent along the edge part having the arc-like cross section.

11. The display device according to claim 10, wherein
the at least one actuator is arranged linearly.

12. The display device according to claim 11, wherein
the at least one actuator arranged linearly is aligned in parallel with a direction in which the substrate is bent along the edge part having the arc-like cross section.

13. The display device according to claim 1, wherein
the at least one actuator is provided with a first electrode and a second electrode opposed to each other with an interposition of a layer to shift from a flexible state to a state to have a predetermined shape and vice versa by being driven electrically.

14. The display device according to claim 1, wherein
the layer to shift from a flexible state to a state to have a predetermined shape and vice versa by being driven electrically, which the at least one actuator is provided with, is a shape memory alloy layer or a polymer material layer having flexibility.

15. The display device according to claim 14, wherein
the state to have the predetermined shape of the shape memory alloy layer or the polymer material layer driven electrically is a state to be more rigid than the flexible state.

\* \* \* \* \*